United States Patent
Bandiera

(10) Patent No.: US 10,330,749 B2
(45) Date of Patent: Jun. 25, 2019

(54) MAGNETIC LOGIC UNIT (MLU) CELL FOR SENSING MAGNETIC FIELDS WITH IMPROVED PROGRAMMABILITY AND LOW READING CONSUMPTION

(71) Applicant: CROCUS Technology SA, Grenoble (FR)

(72) Inventor: Sebastien Bandiera

(73) Assignee: CROCUS TECHNOLOGY SA, Grenoble (FR)

(*) Notice: Subject to any disclaimer, the term of this patent is extended or adjusted under 35 U.S.C. 154(b) by 53 days.

(21) Appl. No.: 15/543,619

(22) PCT Filed: Dec. 23, 2015

(86) PCT No.: PCT/IB2015/059918
§ 371 (c)(1),
(2) Date: Jul. 14, 2017

(87) PCT Pub. No.: WO2016/113619
PCT Pub. Date: Jul. 21, 2016

(65) Prior Publication Data
US 2017/0371008 A1    Dec. 28, 2017

(30) Foreign Application Priority Data
Jan. 16, 2015  (EP) .................................. 15290014

(51) Int. Cl.
G01R 33/09       (2006.01)
G01D 5/16        (2006.01)
(Continued)

(52) U.S. Cl.
CPC ............. *G01R 33/098* (2013.01); *G01D 5/16* (2013.01); *G01R 33/0029* (2013.01);
(Continued)

(58) Field of Classification Search
None
See application file for complete search history.

(56) References Cited

U.S. PATENT DOCUMENTS

2004/0184311 A1*  9/2004  Sharma .................. B82Y 25/00
                                                          365/158
2006/0003185 A1    1/2006  Parkin
(Continued)

FOREIGN PATENT DOCUMENTS

EP           2775480 A1       9/2014

OTHER PUBLICATIONS

International Search Report for PCT/IB2015/059918 dated Feb. 25, 2016.
Written Opinion for PCT/IB2015/059918 dated Feb. 25, 2016.

*Primary Examiner* — Clayton E. LaBalle
*Assistant Examiner* — Jas A Sanghera
(74) *Attorney, Agent, or Firm* — Pearne & Gordon LLP

(57) ABSTRACT

A magnetic logic unit (MLU) cell for sensing magnetic fields, including: a magnetic tunnel junction including a storage layer having a storage magnetization, a sense layer having a sense magnetization; a tunnel barrier layer between the storage layer and the sense layer; and a pinning layer pinning the storage magnetization at a low threshold temperature and freeing it at a high threshold temperature. The sense magnetization is freely alignable at the low and high threshold temperatures and the storage layer induces an exchange bias field magnetically coupling the sense layer such that the sense magnetization tends to be aligned anti-parallel or parallel to the storage magnetization. The tunnel barrier layer is configured for generating an indirect exchange coupling between the tunnel barrier layer and the sense layer providing an additional exchange bias field.

16 Claims, 4 Drawing Sheets

(51) Int. Cl.
*G01R 33/00* (2006.01)
*G11C 11/16* (2006.01)

(52) U.S. Cl.
CPC ........ *G01R 33/096* (2013.01); *G11C 11/1659* (2013.01); *G11C 11/1673* (2013.01)

(56) References Cited

U.S. PATENT DOCUMENTS

2013/0077390 A1* 3/2013 Lombard ................ G11C 11/16 365/158
2014/0145792 A1 5/2014 Wang et al.

* cited by examiner

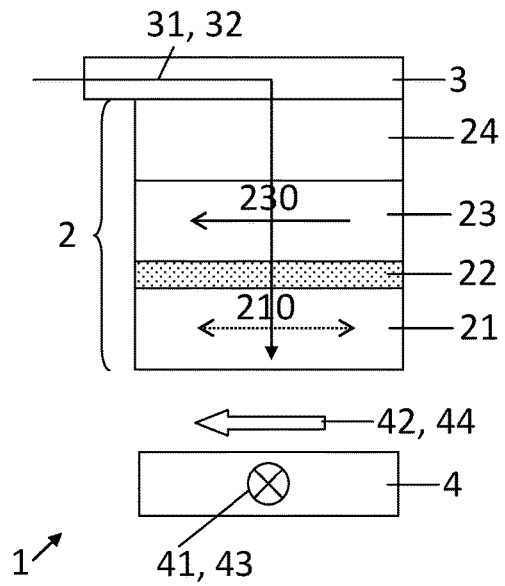
Fig. 1
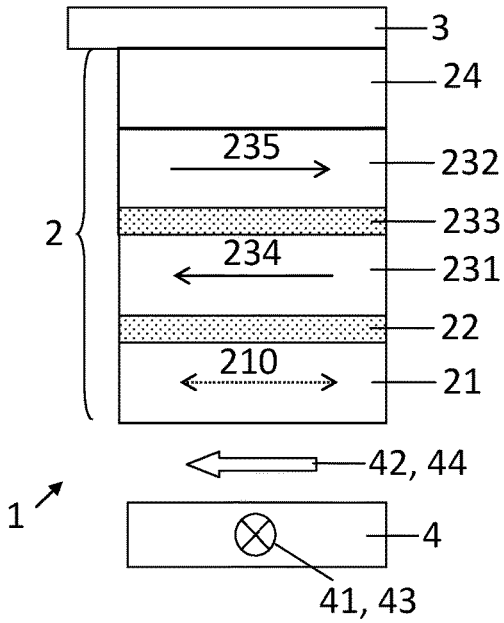
Fig. 2
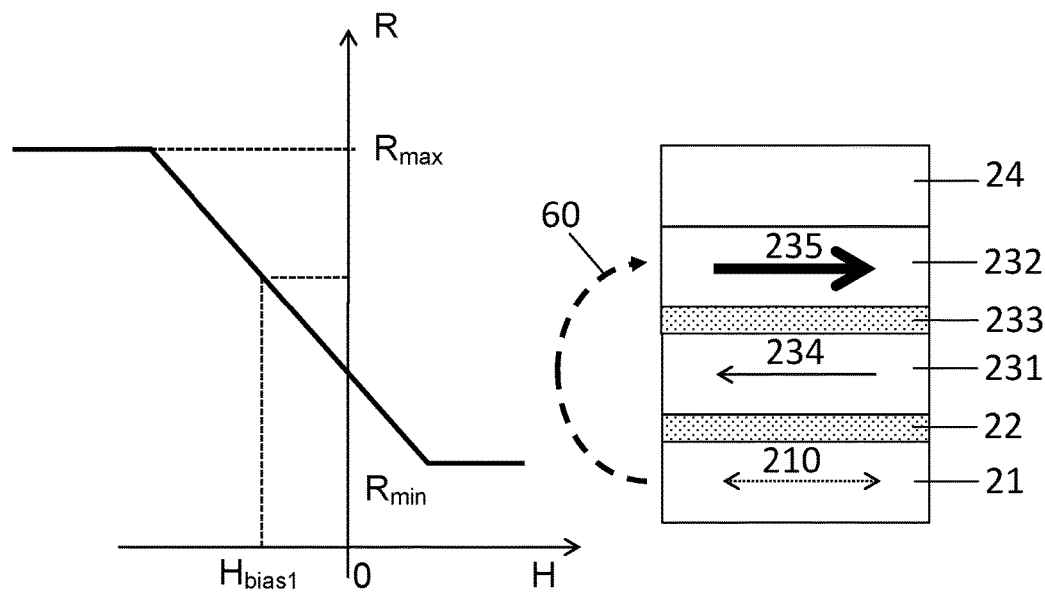
Fig. 4
Fig. 3

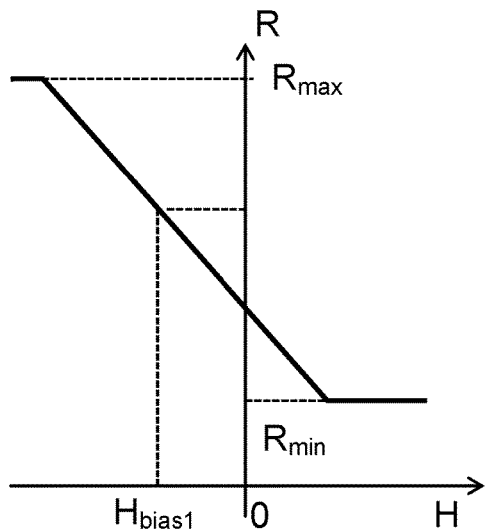
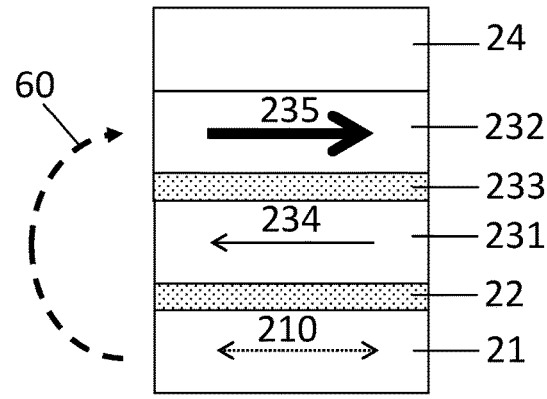
Fig. 10
Fig. 9
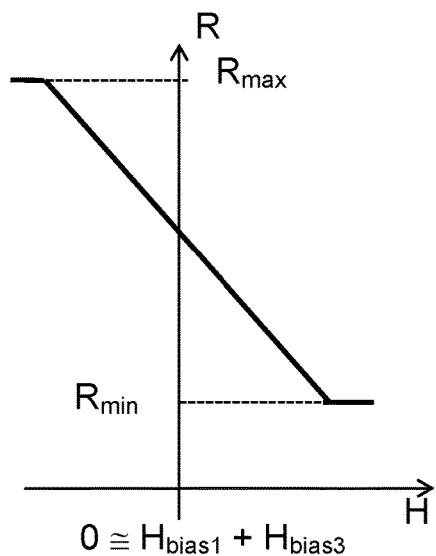
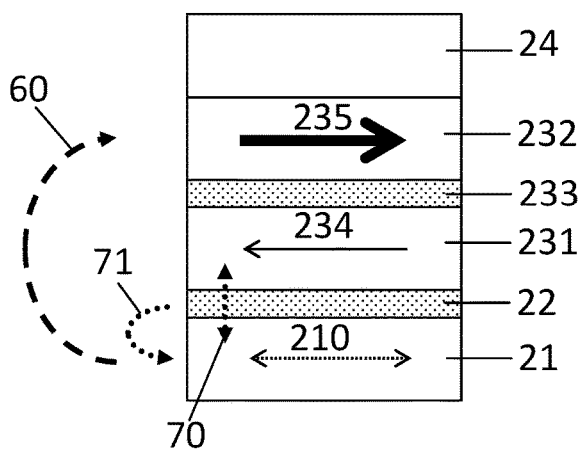
Fig. 12
Fig. 11

MAGNETIC LOGIC UNIT (MLU) CELL FOR SENSING MAGNETIC FIELDS WITH IMPROVED PROGRAMMABILITY AND LOW READING CONSUMPTION

FIELD

The present disclosure concerns a magnetic logic unit (hereinafter MLU) cell for sensing magnetic fields that can be easily programmed and having low reading consumption. The present disclosure further concerns a method for operating the MLU cell.

DESCRIPTION OF RELATED ART

MLU cells can be used to sense magnetic fields, in magnetic sensors or compasses. A MLU cell (see FIG. 1) typically comprises a magnetic tunnel junction 2 including a storage layer 23 having a storage magnetization 230, a sense layer 21 having a free sense magnetization 210 and a tunnel barrier layer 22 between the storage and sense layers. The sense magnetization 210 is orientable in the presence of the external magnetic field while the storage magnetization 230 remains substantially undisturbed by the external magnetic field. The external magnetic field can thus be sensed by measuring a resistance of the magnetic tunnel junction that depends on the relative orientation of the sense magnetization, oriented by the external magnetic field, and the storage magnetization.

Ideally, the sense layer has a linear and non-hysteretic behavior when oriented by the external magnetic field in order to facilitate the measurement of small variations of the external magnetic field. That is relevant when sensing the external magnetic field (such as the earth's magnetic field) having an average value on the order of 0.5 Oersted (Oe).

Such linear and non-hysteretic behavior can be achieved by providing a magnetic tunnel junction where the sense magnetization anisotropy axis is oriented substantially perpendicular to the storage magnetization. This is usually achieved by pinning the storage magnetization perpendicular to an anisotropy axis of the sense layer. The orientation of the anisotropy axis of the sense layer can be defined by sputtering conditions, for example by applying a magnetic field, during the manufacturing of the magnetic tunnel junction.

In an implementation of the MLU cell using a thermally assisted switching (hereinafter TAS) procedure, the storage layer can be exchange biased to an adjacent antiferromagnetic storage layer, or pinning layer 24 (see FIG. 1), pinning the storage magnetization 230 along a particular direction when a temperature within, or in the vicinity of, the pinning layer 24 is at a low threshold temperature $T_L$. The low threshold temperature $T_L$ can correspond to a temperature being below a blocking temperature, a Neel temperature, or another threshold temperature. The pinning layer 24 unpins, or decouples, the storage magnetization 230 when the temperature is at high threshold temperature $T_H$, i.e., at a temperature above the blocking temperature, thereby allowing the storage magnetization 230 to be switched to another direction.

The MLU cell 1 can be programmed using the TAS procedure by heating the magnetic tunnel junction 2 at the high threshold temperature $T_H$ such as to free the storage magnetization 230 and aligning the storage magnetization 230. Heating the magnetic tunnel junction 2 at the high threshold temperature $T_H$ can be performed by passing a heating current 31 in a current line 3 electrically coupled to the MLU cell 1 (see FIG. 1). Aligning the storage magnetization 230 in a programed direction can be performed by passing a programming current 41 in a field line 4 such as to generate a programming magnetic field 42.

Once the storage magnetization 230 has been aligned in the programmed direction, an external magnetic field can be sensed by measuring a resistance R of the magnetic tunnel junction 2. Indeed, the resistance R depends on the relative orientation of the sense and storage magnetizations 210, 230. For example, when the sense magnetization is antiparallel to the storage magnetization, the resistance R of the magnetic tunnel junction is high. On the other hand, sense magnetization is parallel to the storage magnetization; the resistance R of the magnetic tunnel junction becomes low.

A disadvantage of such arrangement is that the storage layer can have a high coercivity requiring using a programming magnetic field 42 having a high magnitude to program the storage magnetization 230.

Another disadvantage is that the storage layer 23 can generate a bias magnetic field on the sense layer 21. The bias magnetic field is added to the external magnetic field that is measured. Consequently, the bias magnetic field has to be cancelled using a sense magnetic field 44 generated by the field line 4. This results in high power consumption when sensing the external magnetic.

In a configuration shown in FIG. 2, the storage layer can comprise a synthetic storage layer, or synthetic antiferromagnet (hereinafter SAF), comprising a first storage ferromagnetic layer 231 having a first storage magnetization 234, a second storage ferromagnetic layer 232 having a second storage magnetization 235, and a storage coupling layer 233 included between the first and second storage ferromagnetic layers 231, 232. The storage coupling layer 233 produces a RKKY coupling between the first and second storage layers 231, 232 such that the second storage magnetization 235 remains antiparallel to the first storage magnetization 234. Such a configuration is not without disadvantages.

Indeed, in order to minimize a coercivity of the storage layer 231, 232, and thus, the magnitude of the programming magnetic field 42 required for aligning the storage magnetization 234, 235, the SAF storage layer is preferably uncompensated. FIG. 3 illustrates a magnetic tunnel junction 2 with a SAF storage layer being uncompensated, i.e., wherein the second storage magnetization 235 has a larger (or lower) magnetic moment than the first storage magnetization 234. The high magnetic moment of the second storage magnetization 235 induces an exchange bias field 60 that tends to align the sense magnetization 210 in a direction antiparallel (or parallel) to the one of the second storage magnetization 235, thus shifting the reversal of the sense magnetization 210 with respect to the reversal in the absence of the exchange bias field 60. FIG. 4 shows a magnetization curve corresponding to the magnetic tunnel junction configuration of FIG. 3, where the resistance R of the magnetic tunnel junction 2 varies linearly with the external magnetic field H. The magnetization curve is shifted by a value corresponding to the exchange bias field (represented as $H_{bias1}$ in FIG. 4). In this configuration, the storage magnetization 234, 235 can be easily aligned in the programmed direction. However, sensing the external magnetic field requires higher power consumption than in the absence of the exchange bias field 60. Indeed, a sense magnetic field 41 generated by injecting a sense field current 43 in the field line 4 is required to compensate the exchange bias field 60.

In FIG. 5, shows a configuration of the magnetic tunnel junction 2 having a compensated SAF storage layer, i.e., wherein the first storage magnetization 234 has a magnetic moment that is substantially the same as the one of the second storage magnetization 235. FIG. 6 shows the magnetization curve corresponding to the magnetic tunnel junction configuration of FIG. 5. Here, the magnetization curve is not shifted and sensing the external magnetic field can be performed with low power consumption and high sensitivity. However, the storage magnetization 234, 235 requires higher power consumption to be aligned in the programmed direction compared to the uncompensated SAF storage layer.

It is thus not possible to operate the MLU cell for sensing an external magnetic field with low power consumption during the sensing step while having at the same time low power consumption during the writing step.

EP2775480 discloses a self-referenced magnetic random access memory (MRAM) cell comprising a magnetic tunnel junction including a sense layer; a storage layer having a storage magnetization; a tunnel barrier layer comprised between the sense and the storage layers; and an antiferromagnetic layer exchange-coupling the storage layer such that the storage magnetization can be pinned when the antiferromagnetic layer is below a critical temperature and freely varied when the antiferromagnetic layer is heated at or above the critical temperature; said sense layer comprising a first sense layer having a first sense magnetization, a second sense layer having a second sense magnetization and spacer layer between the first and second sense layers.

US2006003185 discloses a magnetic tunneling element constructed from a MgO or Mg—ZnO tunnel barrier and an amorphous magnetic layer in proximity with the tunnel barrier. The amorphous magnetic layer includes Co and at least one additional element selected to make the layer amorphous. Magnetic tunnel junctions formed from the amorphous magnetic layer, the tunnel barrier, and an additional ferromagnetic layer have tunneling magnetoresistance values of up to 200% or more.

US2014145792 discloses a synthetic antiferromagnetic (SAF) and synthetic ferrimagnetic (SyF) free layer structures that reduce offset magnetic field (for a SAF free layer), increase perpendicular magnetic anisotropy (PMA), and provide higher thermal stability up to at least 400 DEG C. The SAF and SyF structures have a FL1/DL1/pacer/DL2/FL2 configuration wherein FL1 and FL2 are free layers with PMA, the coupling layer induces antiferromagnetic or ferrimagnetic coupling between FL1 and FL2 depending on thickness, and DL1 and DL2 are dusting layers that enhance the coupling between FL1 and FL2. The SAF free layer may be used with a SAF reference layer in STT-MRAM memory elements or in spintronic devices including a spin transfer oscillator. Furthermore, a dual SAF structure is described that may provide further advantages in terms of Ho, PMA, and thermal stability.

SUMMARY

The present disclosure concerns a MLU cell for sensing magnetic fields, comprising: a magnetic tunnel junction including a storage layer having a storage magnetization, a sense layer having a sense magnetization; a tunnel barrier layer between the storage and sense layers; and a pinning layer pinning the storage magnetization at a low threshold temperature and freeing it at a high threshold temperature; the sense magnetization being freely alignable at the low and high threshold temperatures; the storage layer inducing an exchange bias field magnetically coupling the sense layer such that the sense magnetization tends to be aligned antiparallel or parallel to the storage magnetization;

wherein the tunnel barrier layer is configured for generating an indirect exchange coupling between the tunnel barrier layer and the sense layer such as to provide an additional exchange bias field.

In an embodiment, the tunnel barrier layer is configured such that the additional exchange bias field is of substantially the same magnitude than the one of the exchange bias field and of opposed direction.

The present disclosure further concerns a method for operating the MLU cell, comprising:

during a programming operation, aligning the storage magnetization in a programmed direction; and during a sensing operation, measuring a resistance of the MLU cell having the storage magnetization in the programmed direction;

wherein the tunnel barrier layer is configured such that a magnitude of the additional exchange bias field is substantially the same than the magnitude of the exchange bias field and of opposed direction, such that no additional current need to be passed in the field line for compensating the exchange bias field.

In an embodiment, measuring the resistance can comprise passing a sense field current in a field line in magnetic communication with the MLU cell such as to generate a sense magnetic field capable of aligning the sense magnetization.

BRIEF DESCRIPTION OF THE DRAWINGS

The invention will be better understood with the aid of the description of an embodiment given by way of example and illustrated by the figures, in which:

FIG. 1 shows a MLU cell comprising a magnetic tunnel junction including a storage layer, a sense layer and a tunnel barrier layer;

FIG. 2 shows a MLU cell where the storage layer is a synthetic storage layer;

FIG. 3 illustrates a configuration of the magnetic tunnel junction of FIG. 2 wherein the synthetic storage layer is uncompensated;

FIG. 4 shows a magnetization curve corresponding to the magnetic tunnel junction configuration of FIG. 3;

FIG. 9 represents a magnetic tunnel junction of FIG. 9 wherein the the synthetic storage layer is uncompensated, according to an embodiment;

FIG. 10 shows a magnetization curve corresponding to the magnetic tunnel junction configuration of FIG. 9;

FIG. 11 represents a magnetic tunnel junction of FIG. 9 wherein the synthetic storage layer is uncompensated, according to another embodiment;

FIG. 12 shows a magnetization curve corresponding to the magnetic tunnel junction configuration of FIG. 11.

DETAILED DESCRIPTION OF POSSIBLE EMBODIMENTS

Figure 7:
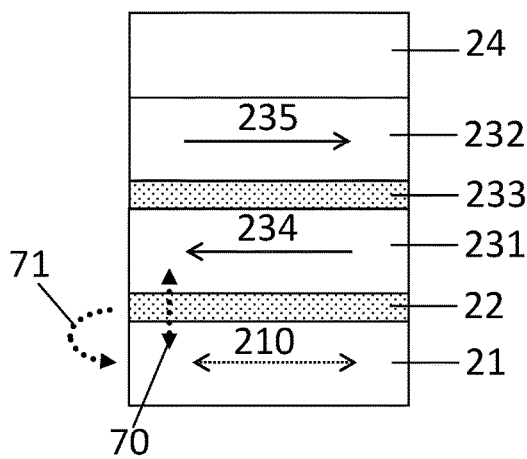
FIG. 7 represents a magnetic tunnel junction comprising a synthetic storage layer and a tunnel barrier layer according to an embodiment, wherein the synthetic storage layer is compensated.

FIG. 7 shows a magnetic tunnel junction 2 of a MLU cell 1 according to an embodiment. The magnetic tunnel junction 2 includes a SAF storage layer comprising a first storage ferromagnetic layer 231 having a first storage magnetization 234, a second storage ferromagnetic layer 232 having a second storage magnetization 235, and a storage coupling layer 233 included between the first and second storage ferromagnetic layers 231, 232. The storage coupling layer 233 produces a RKKY coupling between the first and second storage layers 231, 232 such that the second storage magnetization 235 remains antiparallel to the first storage magnetization 234.

Each of the sense layer 21 and the first and second storage layers 231, 232 can include, or can be formed of, a magnetic material and, in particular, a magnetic material of the ferromagnetic type. A ferromagnetic material can be characterized by a substantially planar magnetization with a particular coercivity, which is indicative of a magnitude of a magnetic field required to reverse the magnetization after it is driven to saturation in one direction. In general, sense layer 21 and the storage layers 231, 232 can include the same ferromagnetic material or different ferromagnetic materials. The storage layers 231, 232 can include a hard ferromagnetic material, namely one having a relatively high magnetic anisotropy field, such as greater than about 50 Oe. The sense layer 21 can include a soft ferromagnetic material, namely one having a relatively low coercivity, such as no greater than about 30 Oe. In such manner, a magnetization of the sense layer 21, or sense magnetization 210, can be readily varied under low-intensity magnetic fields during read operations, while the first and second storage magnetizations 234, 235 remains stable. Suitable ferromagnetic materials include transition metals, rare earth elements, and their alloys, either with or without main group elements. For example, suitable ferromagnetic materials include iron ("Fe"), cobalt ("Co"), nickel ("Ni"), and their alloys, such as permalloy (or Ni80Fe20); alloys based on Ni, Fe, and boron ("B"); Co90Fe10; and alloys based on Co, Fe, and B. In some instances, alloys based on Ni and Fe (and optionally B) can have a smaller coercivity than alloys based on Co and Fe (and optionally B). A thickness of each of the sense layer 21 and the storage layers 231, 232 can be in the nanometer ("nm") range, such as from about 0.3 nm to about 20 nm or from about 1 nm to about 10 nm and preferably between about 0.5 nm and about 4 nm. A thickness of the sense layer 21 is preferably from about 0.3 nm to about 5 nm. The storage coupling layer 233 can comprise a non-magnetic material selected from a group comprising at least one of: ruthenium, chromium, rhenium, iridium, rhodium, silver, copper and yttrium. Preferably, the storage coupling layer 233 comprises ruthenium and has a thickness typically included between about 0.4 nm and 3 nm, preferably between 0.6 nm and about 0.9 nm or between about 1.6 nm and about 2 nm.

The magnetic tunnel junction 2 can further comprise a pinning layer 24, adjacent to the second storage layer 232 and pinning the second storage magnetization 235 along a particular direction when a temperature within, or in the vicinity of, the pinning layer 24 is at a low threshold temperature $T_L$. The pinning layer 24 unpins, or decouples, the storage magnetization 230 when the temperature is at high threshold temperature $T_H$, thereby allowing the storage magnetization 230 to be switched to another direction. The pinning layer 24 can include, or can be formed of, a magnetic material and, in particular, a magnetic material of the antiferromagnetic type. Suitable antiferromagnetic materials include transition metals and their alloys. For example, suitable antiferromagnetic materials include alloys based on manganese ("Mn"), such as alloys based on iridium ("Ir") and Mn (e.g., IrMn); alloys based on Fe and Mn (e.g., FeMn); alloys based on platinum ("Pt") and Mn (e.g., PtMn); and alloys based on Ni and Mn (e.g., NiMn).

In an embodiment, the magnetic tunnel junction 2 of the MLU cell 1 comprises a tunnel barrier layer 22 that is configured for inducing an indirect exchange coupling (represented by the arrow 70) between the tunnel barrier layer 22 and the sense layer 21. The indirect exchange coupling 70 provides an additional exchange bias field 71 that adds to the exchange bias field 60 induced by the storage magnetization 234, 235 of the storage layer 23. The tunnel barrier layer 22 can include, or can be formed of, an insulating material. Suitable insulating materials include oxides, nitride or oxinitride. For example, the tunnel barrier layer 22 can include, or can be formed of, aluminum oxide (e.g., $Al_2O_3$) and/or magnesium oxide (e.g., MgO). A thickness of the tunnel barrier layer 22 can be in the nm range, such as from about 0.5 nm to about 10 nm, and preferably from about 0.5 nm to about 3 nm.

The tunnel barrier layer 22 can be made by depositing an appropriate oxide from an oxide target, or by oxidizing (natural oxidation, plasma oxidation or radical oxidation) a metallic layer.

In the example of FIG. 7, the SAF storage layer is compensated such that the first storage magnetization 234 has a magnetic moment that is substantially the same as the one of the second storage magnetization 235. Consequently, the exchange bias field 60 induced by the first and second storage magnetizations 234, 235 is substantially null. In this example, the additional exchange bias field 71 tends to align the sense magnetization 210 in a direction antiparallel to the one of first storage magnetization 234. The additional exchange bias field 71 thus shifts the reversal of the sense magnetization 210 with respect to the reversal in the absence of the additional exchange bias field 71.

Figure 6:
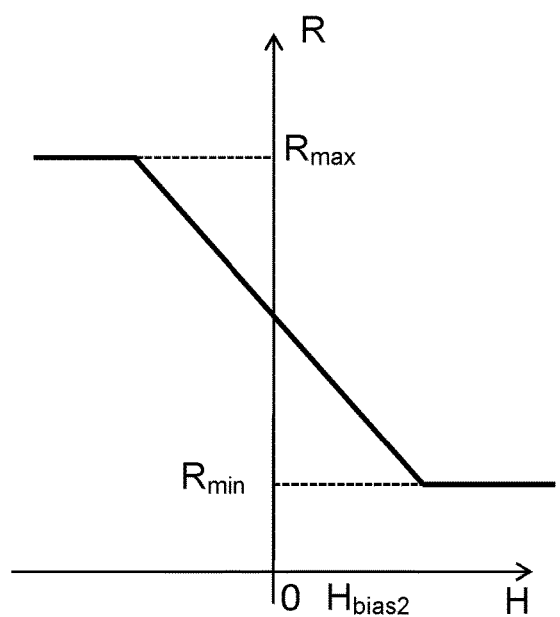
FIG. 6 shows a magnetization curve corresponding to the magnetic tunnel junction configuration of FIG. 5.
Figure 5:
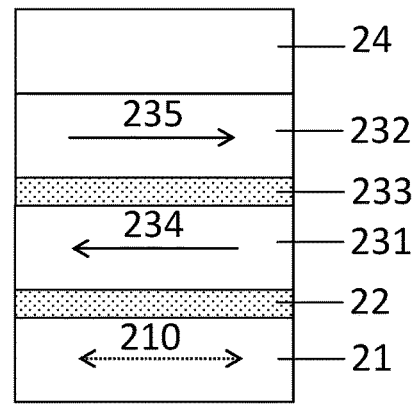
FIG. 5 illustrates a configuration of the magnetic tunnel junction of FIG. 2 wherein the synthetic storage layer is compensated.
Figure 8:
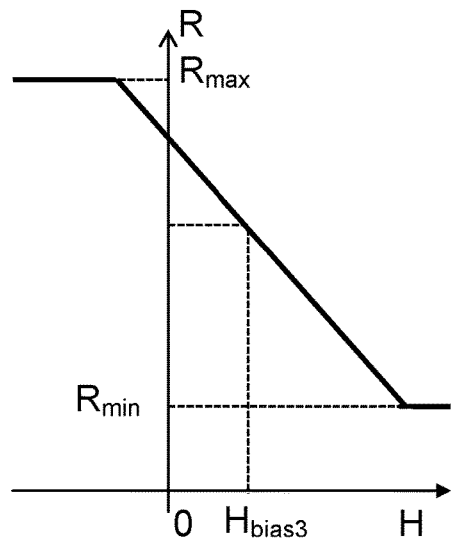
FIG. 8 shows a magnetization curve corresponding to the magnetic tunnel junction configuration of FIG. 7.

FIG. 8 shows a magnetization curve corresponding to the magnetic tunnel junction configuration of FIG. 7, where the resistance R of the magnetic tunnel junction 2 is shown to vary linearly with the external magnetic field H. The magnetization curve is shifted (toward the right in FIG. 8) by a value corresponding to the additional exchange bias field (represented as $H_{bias3}$ in FIG. 8). In this configuration, the storage magnetization 234, 235 of the uncompensated SAF storage layer is difficult to align since it requires higher power consumption to be aligned in the programmed direction. Moreover, since $H_{bias3}$ is not null, sensing the external magnetic field requires high power consumption. Indeed, a sensing magnetic field 43 generated by injecting current into the field line 4 is required to compensate the additional exchange bias field 71.

In a variant shown in FIG. 9, the SAF storage layer is uncompensated. In the present example, the second storage magnetization 235 has a magnetic moment that is substantially larger than the magnetic moment of the first storage magnetization 234. In this particular example, the tunnel barrier layer 22 is configured for inducing substantially no indirect exchange coupling between the tunnel barrier layer 22 and the sense layer 21, such that the additional exchange bias field 71 is substantially null. In this configuration, the high magnetic moment of the second storage magnetization 235 induces an exchange bias field 60 that tends to align the sense magnetization 210 in a direction antiparallel to the one of the exchange bias field 60. The exchange bias field 60 thus shifts the reversal of the sense magnetization 210 with respect to the reversal in the absence of the exchange bias field 60.

FIG. 10 shows a magnetization curve corresponding to the magnetic tunnel junction configuration of FIG. 9, where the resistance R of the magnetic tunnel junction 2 varies linearly with the external magnetic field H. The magnetization curve is shifted (toward the left in FIG. 10) by a value corresponding to the exchange bias field 60 (represented as $H_{bias1}$ in FIG. 10). In this configuration, the storage magnetization 234, 235 can be easily aligned in the programmed direction but sensing the external magnetic field requires high power consumption to compensate the exchange bias field 60. The configuration of the magnetic tunnel junction 2 shown in FIG. 9 and the corresponding magnetization curve of FIG. 10 is similar to the example illustrated in the FIGS. 3 and 4 above.

In another variant shown in FIG. 11, the SAF storage layer is uncompensated. In the present example, the second storage magnetization 235 has a magnetic moment that is substantially larger than the magnetic moment of the first storage magnetization 234. The tunnel barrier layer 22 is configured such as to induce an indirect exchange coupling (represented by the arrow 70) between the tunnel barrier layer 22 and the sense layer 21. The indirect exchange coupling 70 provides an additional exchange bias field 71 that adds to the exchange bias field 60.

The indirect exchange coupling 70 can be adjusted such that the additional exchange bias field 71 is of substantially the same magnitude than the one of the exchange bias field 60 and of opposed direction. In that case, substantially no bias field is applied on the sense layer 21 such that the sense magnetization is only affected by the external magnetic field. The reversal of the sense magnetization 210 is thus substantially not shifted (shift lower than 20 Oe).

FIG. 12 shows a magnetization curve corresponding to the magnetic tunnel junction configuration of FIG. 11, where the resistance R of the magnetic tunnel junction 2 varies linearly with the external magnetic field H. The magnetization curve is substantially not shifted, the eventual residual shift being the algebraic sum of the exchange bias field 60 and the additional exchange bias field 71. In this configuration, the storage magnetization 234, 235 can be easily aligned in the programmed direction and sensing the external magnetic field requires low to no power consumption.

It is understood that the present disclosure is not limited to the exemplary embodiments described above and other examples of implementations are also possible within the scope of the patent claims.

Figure 13:
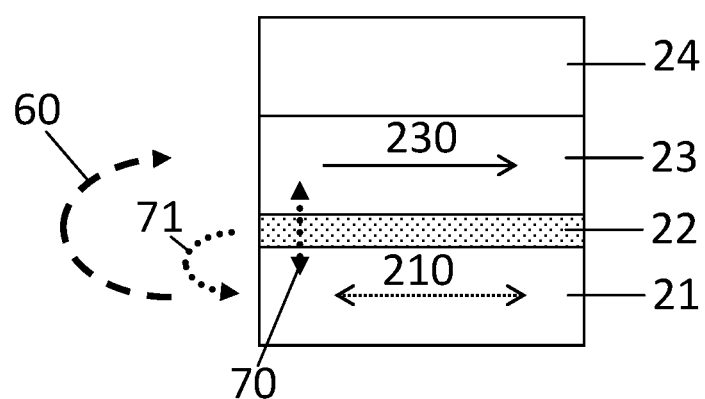
FIG. 13 represents a magnetic tunnel junction with the storage layer comprising a single ferromagnetic layer, according to an embodiment.

For example, a magnetic tunnel junction 2 comprising the tunnel barrier layer 22 of the invention, configured to induce the indirect exchange coupling 70 can comprise a storage layer including a single ferromagnetic layer 23 having a storage magnetization 230 (see FIG. 13). The single ferromagnetic layer 23 exchange couples the sense layer 21, inducing an exchange bias field 60 that tends to align the sense magnetization 210 in a direction antiparallel to the one of the storage magnetization 230. The indirect exchange coupling 70 can be adjusted such that the additional exchange bias field 71 is of substantially same magnitude than the one of the exchange bias field 60 and of opposed direction. In that case, substantially no bias field is applied on the sense layer 21 such that the sense magnetization is not aligned in any specific direction by the sum of the exchange bias field 60 and the indirect exchange coupling 70. The reversal of the sense magnetization 210 is thus not shifted and sensing the external magnetic field only requires low power consumption.

In the above examples, the sense magnetization 210 is alignable in the plane of the sense layer 21 (in-plane). However, the sense magnetization 210 could also be alignable substantially perpendicular to the sense layer 21 (out-of-plane). Similarly, the storage magnetization 230, as well as the first and second storage magnetizations 234, 235, can be aligned out-of-plane.

In an embodiment, adjusting the indirect exchange coupling 70, such as to adjust the direction and magnitude of the additional exchange bias field 71, can comprise the step of controlling the oxidation or nitridation state of the tunnel barrier layer material. Adjusting the indirect exchange coupling 70 can further comprise adjusting a thickness of the tunnel barrier layer 22. Alternatively or in combination, adjusting the indirect exchange coupling 70 can comprise adjusting the composition of the tunnel barrier layer 22 and/or a roughness of the tunnel barrier layer 22.

According to an embodiment not represented, a magnetic sensor device 100 for sensing magnetic fields can include a plurality of MLU cells electrically connected in series to a current line 3 and in magnetic communication with a field line 4. The plurality of MLU cells 1 can be configured in branches, each comprising a subset of MLU cells 1. For example the branches can be oriented at angles of about 0°, about 45°, about 90°, relative to an axis x. The field line 4 may include a plurality of portions, each portion being disposed adjacent to a corresponding one of the branches of MLU cells.

A programming operation of the magnetic sensor device 100, can comprises the steps of aligning the storage magnetization 230, 234, 235 of said plurality of the MLU cell 1 in a programmed direction. In particular, the programming operation can comprise aligning the storage magnetization 230, 234, 235 of the MLU cells 1 comprised each subset in a programmed direction by applying a programming magnetic field 42 in the field line 4 such as to align the storage magnetization 230, 234, 235 in the programmed direction. In the case of a TAS-based programming operation, the method can further comprise the step of passing a heating current 31 in the current line 3 such as to heat the MLU cells 1 in the corresponding subset at the high threshold temperature $T_H$ and unpin the storage magnetization 230, 234,235 of the MLU cells 1. After, or simultaneously with the step of aligning the storage magnetization 230, 234,235 in the programmed direction, the method can comprise the step of cooling the MLU cells 1 comprised in the corresponding subset to the low threshold temperature $T_L$ such as to pin the switching the storage magnetization 230, 234, 235 in the programmed direction.

A sensing operation of the magnetic sensor device 100 can comprise passing a sensing current 32 in the current branches such as to measure an average resistance $R_a$. Here, the average resistance $R_a$ corresponds to the resistance measured in series for the MLU cells 1 comprised in a branch. The resistance of each MLU cell is determined by the relative orientation of the sense magnetization 210 with respect to the storage magnetization 230, 234, 235. The sense magnetization 210 can be varied by passing a sense field current 43 in the field line portions 4 such as to generate a sense magnetic field 44. The sense field current 43 can be alternated such as to modulate the sense magnetic field 44 and the average resistance $R_a$ in accordance with the polarity of the sense field current 43. Since the sense magnetization 210 anisotropy axis is initially substantially perpendicular to the storage magnetization 230, 234, 235 the response will be linear.

In contrast with a conventional MLU cells, the sensing operation can be performed without injecting a current in the field line 4 in order to compensate the exchange bias field 60.

REFERENCE NUMBERS AND SYMBOLS

1 MLU cell
100 magnetic sensor device
2 magnetic tunnel junction
21 sense layer
22 tunnel barrier layer
23 storage layer
210 sense magnetization
230 storage magnetization
231 first storage ferromagnetic layer
232 second storage ferromagnetic layer
233 storage coupling layer
234 first storage magnetization
235 second storage magnetization
24 antiferromagnetic storage layer, pinning layer
3 current line
31 heating current
32 sensing current
4 field line
41 programming current
42 programming magnetic field
43 sense field current
44 sense magnetic field
60 exchange bias field
70 indirect exchange coupling
71 additional exchange bias field
H external magnetic field
$H_{bias}$ shift of the hysteresis loop
R resistance of magnetic tunnel junction
$R_a$ average resistance
$T_H$ high threshold temperature
$T_L$ low threshold temperature

What is claimed is:

1. A magnetic logic unit (MLU) cell for sensing magnetic fields, comprising:
    a magnetic tunnel junction including a storage layer having a storage magnetization, a sense layer having a sense magnetization, a tunnel barrier layer between the storage layer and the sense layer, and a pinning layer pinning the storage magnetization at a low threshold temperature and freeing it at a high threshold temperature; the sense magnetization being freely alignable at the low and high threshold temperatures;
    the storage layer inducing an exchange bias field magnetically coupling the sense layer such that the sense magnetization is aligned antiparallel or parallel to the storage magnetization;
    wherein the tunnel barrier layer is configured for generating an indirect exchange coupling between the tunnel barrier layer and the sense layer such as to provide an additional exchange bias field.

2. The MLU cell according to claim 1, wherein the storage layer comprises a single ferromagnetic layer having a storage magnetization inducing the exchange bias field.

3. The MLU cell according to claim 1,
    wherein the storage layer comprises a synthetic antiferromagnet including a first ferromagnetic layer having a first storage magnetization, a second storage ferromagnetic layer having a second storage magnetization, and a storage anti-parallel coupling layer producing a RKKY coupling between the first and second ferromagnetic layers; and
    wherein a moment of one of the first and second storage magnetization is larger than the other; the storage magnetization having the larger moment inducing the exchange bias field.

4. The MLU cell according to claim 1, wherein the tunnel barrier layer is configured such that the additional exchange bias field is of substantially the same magnitude than the one of the exchange bias field and of opposed direction.

5. The MLU cell according to claim 4, wherein said indirect exchange coupling is such that a reversal of the sense magnetization is shifted by less than about 100 Oe for the magnetic tunnel junction having a size of less than about 300 nm.

6. The MLU cell according to claim 5, wherein a direction of the storage magnetization can be switched using a magnetic field of less than about 400 Oe when the magnetic tunnel junction is at the high threshold temperature.

7. The MLU cell according to claim 1, wherein the tunnel barrier layer comprises an oxide, nitride or oxi-nitride and has a thickness between about 0.5 nm and about 3 nm.

8. The MLU cell according to claim 7, wherein the tunnel barrier layer includes, or is formed of, aluminum oxide or magnesium oxide.

9. The MLU cell according to claim 7, wherein the tunnel barrier layer is obtained by depositing an oxide from an oxide target.

10. The MLU cell according to claim 7, wherein the tunnel barrier layer is obtained by oxidizing a metallic layer.

11. The MLU cell according to claim 10, wherein the tunnel barrier layer is obtained by natural oxidation or radical oxidation of the metallic layer.

12. The MLU cell according to claim 1, wherein the direction and magnitude of the additional exchange bias field is adjustable by adjusting the oxidation or nitridation state of the material included, or forming, the tunnel barrier layer.

13. The MLU cell according to claim 12, wherein the direction and magnitude of the additional exchange bias field is further adjustable by adjusting a thickness and/or a roughness and/or the composition of the tunnel barrier layer.

14. A method for operating a MLU cell comprising a magnetic tunnel junction including a storage layer having a storage magnetization, a sense layer having a sense magnetization, a tunnel barrier layer between the storage layer and the sense layer, and a pinning layer pinning the storage magnetization at a low threshold temperature and freeing it at a high threshold temperature; the sense magnetization being freely alignable at the low and high threshold temperatures; the storage layer inducing an exchange bias field magnetically coupling the sense layer such that the sense magnetization is aligned antiparallel or parallel to the storage magnetization; the tunnel barrier layer is configured for generating an indirect exchange coupling between the tunnel barrier layer and the sense layer such as to provide an additional exchange bias field; the method comprising:
    during a programming operation, aligning the storage magnetization in a programmed direction; and
    during a sensing operation, measuring a resistance of the MLU cell having the storage magnetization in the programmed direction;
    wherein the tunnel barrier layer is configured such that the additional exchange bias field is of substantially the same magnitude than the one of the exchange bias field and of opposed direction, such that substantially no additional current need to be passed in a field line for compensating the exchange bias field.

15. The method according to claim 14, wherein said measuring the resistance comprises passing a sense field current in a field line in magnetic communication with the MLU cell such as to generate a sense magnetic field capable of aligning the sense magnetization.

16. The method according to claim 14, wherein said measuring the resistance further comprises passing a sensing current in a current line and the magnetic tunnel junction.

* * * * *